(12) United States Patent
Kuroyanagi et al.

(10) Patent No.: US 9,177,844 B2
(45) Date of Patent: Nov. 3, 2015

(54) TRANSPORT SYSTEM

(71) Applicant: DENSO CORPORATION, Kariya, Aichi-pref. (JP)

(72) Inventors: Masaaki Kuroyanagi, Anjo (JP); Toshihiro Okumura, Nukata-gun (JP); Keisuke Yoshida, Nishio (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/079,698

(22) Filed: Nov. 14, 2013

(65) Prior Publication Data

US 2014/0147235 A1    May 29, 2014

(30) Foreign Application Priority Data

Nov. 27, 2012 (JP) ................................. 2012-258842

(51) Int. Cl.
*H01L 21/677* (2006.01)

(52) U.S. Cl.
CPC ...... *H01L 21/6773* (2013.01); *H01L 21/67715* (2013.01); *H01L 21/67727* (2013.01); *H01L 21/67766* (2013.01); *H01L 21/67769* (2013.01)

(58) Field of Classification Search
CPC ..................... H01L 21/6773; H01L 21/67715; H01L 21/67727; H01L 21/67766; H01L 21/67769
USPC ...................................................... 198/465.2
See application file for complete search history.

(56) References Cited

U.S. PATENT DOCUMENTS

| | | | | |
|---|---|---|---|---|
| 5,237,510 A | * | 8/1993 | Kakizawa et al. | 700/214 |
| 5,404,894 A | | 4/1995 | Shiraiwa | |
| 5,411,358 A | * | 5/1995 | Garric et al. | 414/277 |
| 7,308,757 B2 | | 12/2007 | Fukuhara et al. | |
| 7,859,685 B2 | * | 12/2010 | Fogel | 356/614 |
| 2002/0044860 A1 | | 4/2002 | Hayashi et al. | |
| 2002/0150447 A1 | | 10/2002 | Mizokawa et al. | |
| 2008/0187413 A1 | * | 8/2008 | Kondoh | 414/217 |

FOREIGN PATENT DOCUMENTS

| | | |
|---|---|---|
| JP | 04-352343 A | 12/1992 |
| JP | 2004-221277 A | 8/2004 |
| JP | 2004-303833 A | 10/2004 |
| JP | 2005-223031 A | 8/2005 |

OTHER PUBLICATIONS

Office Action mailed on Sep. 24, 2014 in the corresponding JP Application No. 2012-258842 (with English translation).

* cited by examiner

*Primary Examiner* — Dean Kramer
*Assistant Examiner* — Ashley Romano
(74) *Attorney, Agent, or Firm* — Posz Law Group, PLC

(57) ABSTRACT

A process-line-to-process-line transport apparatus transports a transport subject between corresponding two of process lines. A first transport vehicle transports the transport subject in a first process line, and a second transport vehicle transports the transport subject in a second process line. A relay stocking apparatus is placed in a corresponding location, at which the relay stocking apparatus receives the transport subject from one of the first transport vehicle and the second transport vehicle and passes the received transport subject to the other one of the first transport vehicle and the second transport vehicle.

15 Claims, 4 Drawing Sheets

TRANSPORT SYSTEM

CROSS REFERENCE TO RELATED APPLICATION

This application is based on and incorporates herein by reference Japanese Patent Application No. 2012-258842 filed on Nov. 27, 2012.

TECHNICAL FIELD

The present disclosure relates to a transport system, which transports a transport subject.

BACKGROUND

For instance, JP2004-221277A teaches a transport system, which includes a process-line-to-process-line transport apparatus and is operated in a manufacturing facility. The process-line-to-process-line transport apparatus is an apparatus that transports a transport subject between each corresponding two of a plurality of process lines, each of which includes a plurality of corresponding manufacturing apparatuses. In the case of the manufacturing facility disclosed in JP2004-221277A, three semiconductor manufacturing process lines, the process-line-to-process-line transport apparatus and a host computer are provided. In this manufacturing facility, the process-line-to-process-line transport apparatus transports a transport subject (specifically, silicon wafers received in a cassette), which is processed in one of the process lines, to another one of the process lines, and so on, and the host computer controls each of the process lines and the process-line-to-process-line transport apparatus. Furthermore, each process line has a stocking apparatus (also referred to as a stocker) and a transport vehicle. The stocking apparatus stocks the transport subject that is transported by the process-line-to-process-line transport apparatus, and the transport vehicle transports the transport subject between the stocking apparatus and a corresponding one of the semiconductor manufacturing apparatuses. When a predetermined time period elapses after the completion of the transportation of the transport subject, the transport vehicle is moved to a waiting location unless a next transporting command is received. In this way, influences of, for example, dust, which is discharged from the transport vehicle, on the manufacturing apparatuses is reduced or limited.

The manufacturing apparatuses of each process line are arranged in a manner that reduces or minimizes a transport loss even in a case where various types of transport subjects are transported in order to meet a need for small lot production of many products.

For instance, in the transport system, in which the transport subject is transferred from one process line to the other process line after completion of the processes of the transport subject by the manufacturing apparatuses of the one process line, even in a case where one or more of the manufacturing apparatuses is stopped in the one process line due to a failure or maintenance work thereof, it may be demanded to process the transport subject by using the other manufacturing apparatus(es). In order to meet such a demand, it is conceivable to use one or more of the manufacturing apparatuses of the other process line (the process line located adjacent to the one process line), which have the same functions as those of the manufacturing apparatuses of the one process line, to continue the processing of the transport subject. In general, the manufacturing apparatuses, which have the same functions, are gathered together to meet the requirements of the manufacturing facility even if the manufacturing apparatuses are provided in the different process lines.

In such a case, when the transport subject, which is processed in the manufacturing apparatus before stopping of the manufacturing apparatus in the one process line, is transported to the manufacturing apparatus of the other process line, the transport subject needs to be transported through the following transport path. That is, the transport subject, which has been processed in the manufacturing apparatus of the one process line, is transported to the stocking apparatus of the one process line by the transport vehicle of the one process line. Thereafter, the transport subject, which is placed on the stocking apparatus of the one process line, is transported to the stocking apparatus of the other process line by the process-line-to-process-line transport apparatus. Then, the transport subject, which is placed on the stocking apparatus of the other process line, is transported to the corresponding manufacturing apparatus of the other process line by the transport vehicle of the other process line.

Here, when the transport subject is transported from the one process line to the other process line by using the process-line-to-process-line transport apparatus and the two stocking apparatuses, the transport path is lengthened even in the case of the one process line and the other process line, which are placed adjacent to each other. Furthermore, the process-line-to-process-line transport apparatus, which is not normally required, is used. Therefore, it will have an influence on the process-line-to-process-line transportation at the remaining process lines. Thus, the transport time of the entire transport system is disadvantageously increased.

SUMMARY

The present disclosure is made in view of the above disadvantages. According to the present disclosure, there is provided a transport system, which includes a process-line-to-process-line transport apparatus, a first transport vehicle, a second transport vehicle and a relay stocking apparatus. The process-line-to-process-line transport apparatus is configured to transport a transport subject between corresponding two of a plurality of process lines, which includes a first process line and a second process line. Each of the plurality of process lines includes a plurality of corresponding manufacturing apparatuses. The first transport vehicle is configured to transport the transport subject between a first stocking apparatus and one of the plurality of corresponding manufacturing apparatuses of the first process line and between each corresponding two of the plurality of corresponding manufacturing apparatuses of the first process line. The first stocking apparatus is configured to receive the transport subject, which is transported by the process-line-to-process-line transport apparatus to the first stocking apparatus. The second transport vehicle is configured to transport the transport subject between a second stocking apparatus and one of the plurality of corresponding manufacturing apparatuses of the second process line and between each corresponding two of the plurality of corresponding manufacturing apparatuses of the second process line. The second stocking apparatus is configured to receive the transport subject, which is transported by the process-line-to-process-line transport apparatus to the second stocking apparatus. The relay stocking apparatus is placed in a corresponding location, at which the relay stocking apparatus is configured to receive the transport subject from one of the first transport vehicle and the second transport vehicle and pass the received transport subject to the other one of the first transport vehicle and the second transport vehicle.

BRIEF DESCRIPTION OF THE DRAWINGS

The drawings described herein are for illustration purposes only and are not intended to limit the scope of the present disclosure in any way.

DETAILED DESCRIPTION

An embodiment of the present disclosure will be described with reference to the accompanying drawings.

Figure 1:
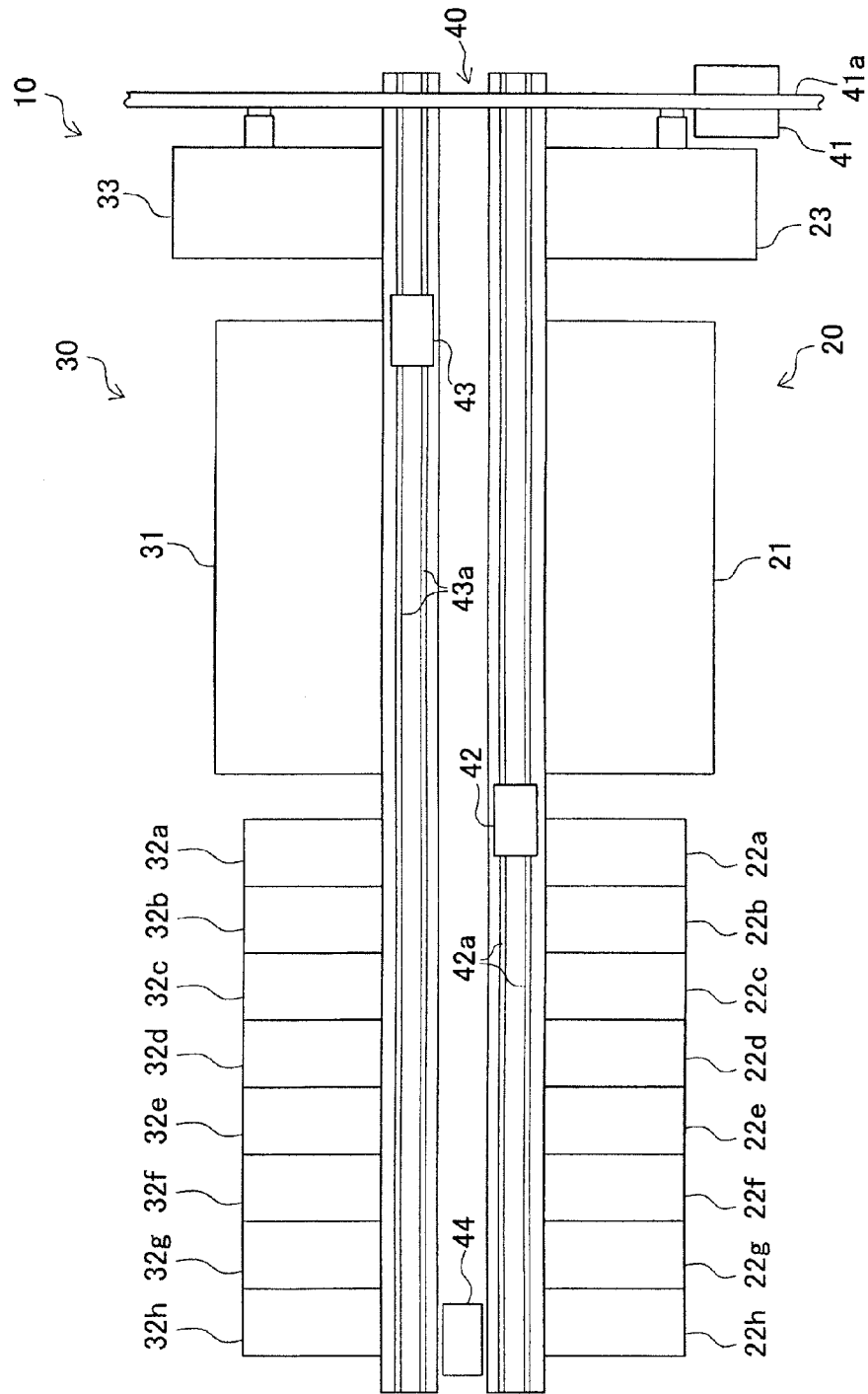
FIG. 1 is a schematic diagram showing a layout of a transport system according to an embodiment of the present disclosure.

A transport system 40 shown in FIG. 1 is a transport system used in a manufacturing facility (factory) 10, which manufactures semiconductor devices. Specifically, the transport system 40 transports a transport subject, which is a manufacturing subject (or alternatively a container receiving the manufacturing subject), to each corresponding one of a plurality of process lines (also referred to as bays), each of which has a plurality of corresponding manufacturing apparatuses (also referred to as tools). The transport system 40 executes both of process-line-to-process-line transportation (also referred to as line-to-line transportation or interbay transportation) and process-line-internal transportation (also referred to as line-internal transportation or intrabay transportation). The process-line-to-process-line transportation of the transport subject is defined as transportation of the transport subject between each corresponding two of the process lines. The process-line-internal transportation is defined as transportation of the transport subject within the corresponding process line. In the process-line-to-process-line transportation of the present embodiment, the transport subject (the material) is transported between each corresponding two of the process lines, which includes a first process line (also referred to as a first bay) 20 and a second process line (also referred to as a second bay) 30. In the process-line-internal transportation of the present embodiment, the transport subject is transported between, for example, each corresponding two of the manufacturing apparatuses in a corresponding one of the process lines.

In the present embodiment, the transport subject, which is transported to the first process line 20 and the second process line 30, is, for example, a semiconductor wafer that requires cleaning treatment and heat treatment.

Furthermore, the first process line 20 has a cleaning apparatus (serving as a manufacturing apparatus) 21 and a plurality of diffusion furnace apparatuses (serving as manufacturing apparatuses) 22a-22h. The cleaning apparatus 21 performs the cleaning treatment of the semiconductor wafer. Each of the diffusion furnace apparatuses 22a-22h performs the predetermined heat treatment on each cleaned semiconductor wafer. The cleaning apparatus 21 has a transferring mechanism. The transferring mechanism of the cleaning apparatus 21 transfers the transport subject, which is placed on a stage thereof, into a cleaning bath. Thereafter, the transferring mechanism returns the cleaned transport subject from the cleaning bath to the stage of the cleaning apparatus 21. Each diffusion furnace apparatus 22a-22h has a transferring mechanism. The transferring mechanism of the diffusion furnace apparatus 22a-22h transfers the transport subject, which is placed on a stage thereof, into a furnace of the diffusion furnace apparatus 22a-22h. Thereafter, the transferring mechanism returns the transport subject back to the stage of the diffusion furnace apparatus 22a-22h. Each of the diffusion furnace apparatus 22a-22h may be constructed to have the same heat treatment function. Alternatively, one or more of the diffusion furnace apparatus 22a-22h may be constructed to have different heat treatment function, which is different from that of the rest of the diffusion furnace apparatuses 22a-22h.

The first process line 20 also has a stocking apparatus (also referred to as a stocker) 23, such as an opener, at an end of a process-line-internal transport path of the first process line 20. The stocker 23 functions as a station, on which the transport subject before the treatments and the transport subject after the treatments is temporarily placed.

The second process line 30 has a cleaning apparatus 31, a plurality of diffusion furnace apparatuses 32a-32h and a stocking apparatus (also referred to as a stocker) 33, which have the similar functions as the cleaning apparatus 21, the diffusion furnace apparatuses 22a-22h and the stocking apparatus 23, respectively, of the first process line 20. The cleaning apparatus 21, the diffusion furnace apparatuses 22a-22h and the stocking apparatus 23 of the first process line 20 are respectively opposed to the cleaning apparatus 31, the diffusion furnace apparatuses 32a-32h and the stocking apparatus 33 of the second process line 30 while rails 42a, 43a described later are interposed therebetween, so that the similar manufacturing apparatuses, which have the similar functions, are opposed to each other in a direction perpendicular a longitudinal direction of the rails 42a, 43a (see FIG. 1). The stocking apparatus 23 serves as a first stocking apparatus, and the stocking apparatus 33 serves as a second stocking apparatus.

Next, a characteristic feature of the transport system 40 will be described.

The transport system 40 has one, two or more overhead hoist transport(s) (OHT) 41, two rail guided vehicles (RGV) 42, 43, a relay stocking apparatus (also referred to as a relay stocker) 44 and a control device 45. The OHT 41 serves as a process-line-to-process-line transport apparatus (also referred to as an interbay transport apparatus). The RGVs 42, 43 respectively serve as a process-line-internal transport apparatus (also referred to as an intrabay transport apparatus) of the first process line 20 and a process-line-internal transport apparatus (also referred to as an intrabay transport apparatus) of the second process line 30. The control device 45 controls the entire transportation of the transport system 40.

The OHT 41 receives a command from the control device 45 and travels along a rail 41a, which is hung from a ceiling, while holding the transport subject. The OHT 41 picks up or drops (i.e., takes or places) the transport subject at the corresponding stocking apparatus that is located at the end of the process-line-internal transport path of the corresponding process line.

Figure 2:
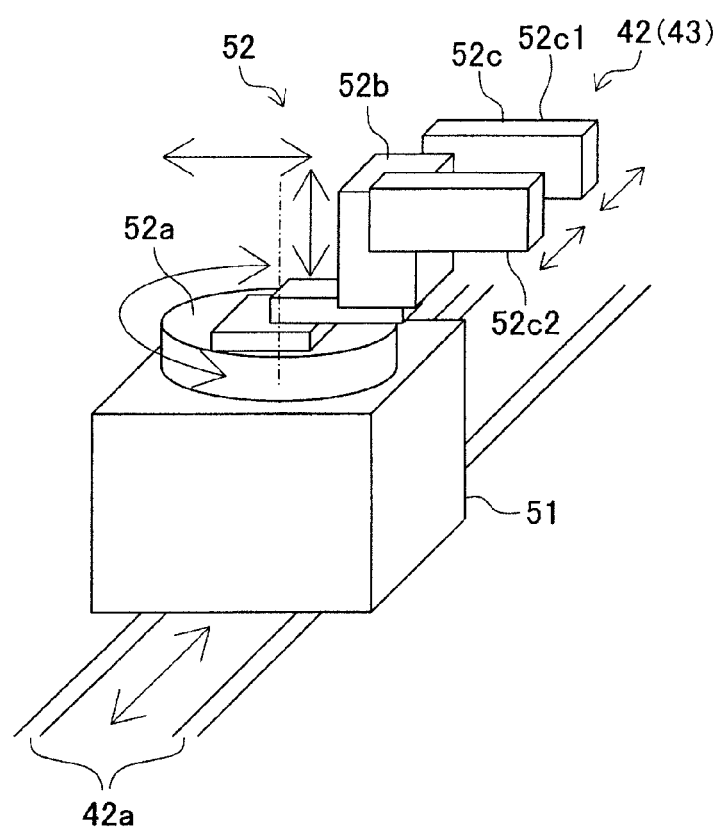
FIG. 2 is a schematic perspective view schematically showing a structure of a rail guided vehicle of the present embodiment.

The RGV 42 is a transport vehicle, which transports the transport subject between the stocking apparatus 23 and one of the manufacturing apparatuses (i.e., the cleaning apparatus 21 and the diffusion furnace apparatuses 22a-22h) of the first process line 20 and between each corresponding two of the manufacturing apparatuses of the first process line 20. Here, it should be noted that the RGV 42 and the RGV 43 have substantially the identical structure and the identical function. Therefore, in the following description, only the structure and the function of the RGV 42 will be described in detail with reference to FIG. 2 while the description of the structure and the function of the RGV 43 will be omitted for the sake of simplicity. FIG. 2 is a schematic perspective view schematically showing the structure of the RGV 42.

The RGV 42 travels while holding the transport subject along the rails 42a that linearly extend along a linear transport path in a direction of a row of the apparatuses, along which the stocking apparatus 23, the cleaning apparatus 21 and the diffusion furnace apparatuses 22a-22h of the first process line 20 are arranged in this order. The RGV 42 serves as a first transport vehicle.

As shown in FIG. 2, the RGV 42 has a vehicle unit 51 and a transferring hand unit 52. The vehicle unit 51 is a carrier, which carries the transferring hand unit 52. The vehicle unit 51 travels along the rails 42a. The transferring hand unit 52 is placed on the vehicle unit 51. The transferring hand unit 52 has a rotatable device 52a, an extendable and retractable device 52b and a clamper device 52c. The rotatable device 52a is placed on a top surface of the vehicle unit 51. The rotatable device 52a is rotatable relative to the top surface of the vehicle unit 51 for 360 degrees from a rotational reference position, at which the clamper device 52c supported by the rotatable device 52a through the extendable and retractable device 52b is directed to oppose the corresponding manufacturing apparatus upon placement of the RGV 42 in front of the corresponding manufacturing apparatus. The extendable and retractable device 52b is placed on an upper surface of the rotatable device 52a. The extendable and retractable device 52b is extendable and retractable in a direction perpendicular to a rotational axis of the rotatable device 52a and is also extendable and retractable in a direction of the rotational axis of the rotatable device 52a from a transporting position, which is a position of the extendable and retractable device 52b at the time of transporting the transport subject. The clamper device 52c is placed at an upper end portion of the extendable and retractable device 52b, which is opposite from the rotatable device 52a. The clamper device 52c can be driven between a clamping state, at which two arms 52c1, 52c2 of the clamper device 52c clamp the transport subject, and a releasing state, at which the arms 52c1, 52c2 of the clamper device 52c release the clamped transport subject.

With the above-described construction, at the time of taking the transport subject at the stage of the stocking apparatus 23 or the corresponding one of the manufacturing apparatuses upon receiving a command from the control device 45, the RGV 42 is operated in the following manner.

First of all, the vehicle unit 51 travels along the rails 42a to move the transferring hand unit 52 to the corresponding stage. At the corresponding stage, the extendable and retractable device 52b is extended or retracted to a predetermined position to place the clamper device 52c to a location, at which the clamper device 52c can clamp the transport subject located on the stage. Then, the clamper device 52c clamps the transport subject. Thereafter, the extendable and retractable device 52b returns to the transporting position while the clamper device 52c clamps the transport subject. Thereby, the transport subject is clamped by the RGV 42 (more specifically the clamper device 52c of the RGV 42) to enable the transportation of the transport subject by the RGV 42.

Furthermore, at the time of dropping the clamped transport subject onto the stage of the stocking apparatus 23 or the corresponding one of the manufacturing apparatuses upon receiving a command from the control device 45, the RGV 42 is operated in the following manner.

First of all, the vehicle unit 51 travels along the rails 42a to move the transferring hand unit 52, which clamps the transport subject, to the corresponding stage. At the corresponding stage, the extendable and retractable device 52b is extended or retracted to a predetermined position to place the clamped transport subject, which is clamped by the clamper device 52c, on the stage. Then, the clamped transport subject is placed on the stage when the clamper device 52c releases the clamped transport subject.

The stage of each manufacturing apparatus is placed on the same side of the rails 42a. Therefore, at the time of picking up or dropping (the time of taking or placing) of the transport subject at the stage of each manufacturing apparatus, the rotatable device 52a is positioned in the rotational reference position. In contrast, in the case where the transport subject is picked up or dropped at the stocking apparatus, such as the relay stocking apparatus 44, which is located on the opposite side of the rails 42a that is opposite from each manufacturing apparatus in the direction perpendicular to the longitudinal direction of the rails 42a, the rotatable device 52a is placed in the state where the rotatable device 52a is rotated by 180 degrees from the rotational reference position.

Furthermore, the RGV 43 travels while holding the transport subject along rails 43a that linearly extend along a linear transport path in a direction of a row of the apparatuses, along which the stocking apparatus 33, the cleaning apparatus 31 and the diffusion furnace apparatuses 32a-32h of the second process line 30 are arranged in this order. Similar to the RGV 42, the RGV 43 has the vehicle unit 51 and the transferring hand unit 52 and transports the transport subject between the stages of each corresponding two of the stocking apparatus 33 and the manufacturing apparatuses (i.e., the cleaning apparatus 31 and the diffusion furnace apparatuses 32a-32h). The RGV 43 serves as a second transport vehicle.

Figure 3:
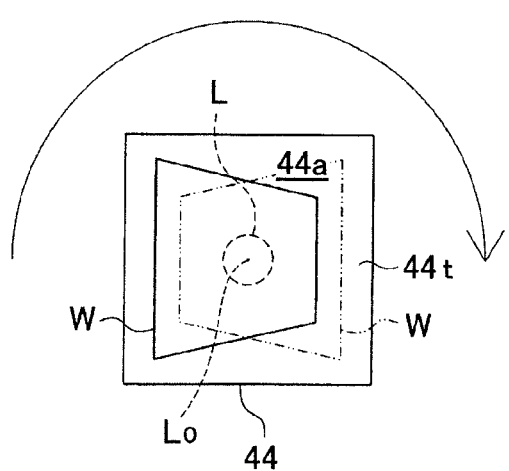
FIG. 3 is a schematic diagram for describing a rotational state of a receiving surface of a table of a relay stocking apparatus of the embodiment.

FIG. 3 is a schematic diagram for describing a rotational state of a receiving surface 44a of a rotatable table 44t of the relay stocking apparatus 44.

The relay stocking apparatus 44 is a relay stage, on which the transport subject is temporarily placed. The relay stocking apparatus 44 is configured to receive the transport subject W from one of the RGV 42 and the RGV 43 and pass the received transport subject W to the other one of the RGV 42 and the RGV 43. More specifically, the relay stocking apparatus 44 is placed in a corresponding location, which is between the rails 42a and the rails 43a and at which the transport subject can be picked up or dropped at the relay stocking apparatus 44 by each of the RGV 42 and the RGV 43. Particularly, the relay stocking apparatus 44 includes a rotating mechanism (not shown). When the rotating mechanism is operated, the receiving surface 44a of the table 44t is rotated about a rotational center Lo of a rotatable shaft L (i.e., a rotational axis of the rotatable shaft L) for at least 180 degrees in a plane of the receiving surface 44a of the table 44t, as shown in FIG. 3. The rotating mechanism is driven to rotate for 180 degrees in response to a command that is outputted from the RGV 42 or the RGV 43, which has placed the transport subject on the receiving surface 44a of the table 44t. In FIG. 3, the transport subject W before the rotation of the receiving surface 44a of the table 44t is indicated by a solid line, and the transport subject W after the rotation of the receiving surface 44a of the table 44t is indicated by a dot-dot dash line.

Figure 4:
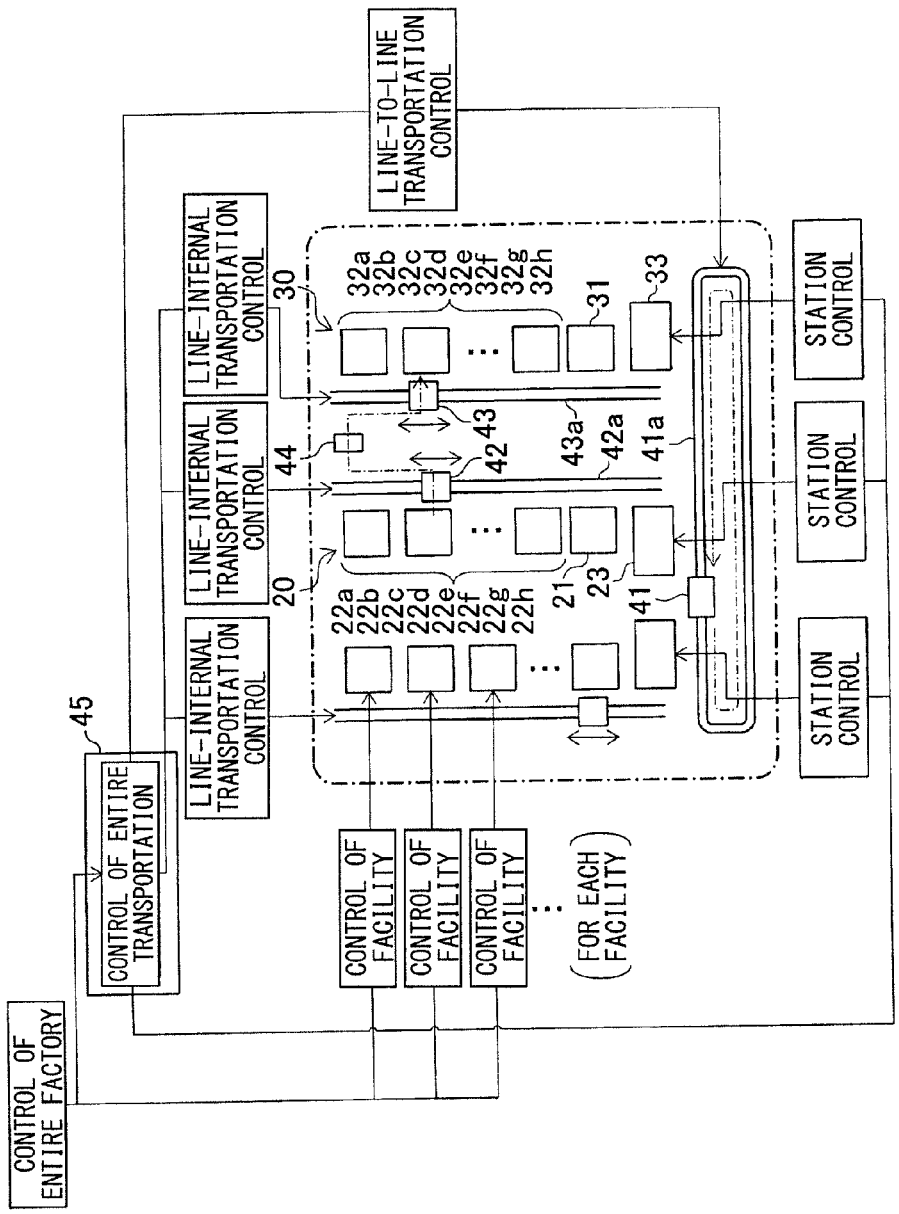
FIG. 4 is a schematic diagram schematically showing a control system of an entire manufacturing facility that includes the transport system of the embodiment.

FIG. 4 is a schematic diagram showing an entire control system of the manufacturing facility 10, which includes the transport system 40.

As shown in FIG. 4, the control device 45 executes a process-line-to-process-line transportation control operation, which uses the OHT 41, and a process-line-internal transportation control operation, which uses the RGVs 42, 43, in response to a transporting command outputted from an upper terminal, which controls the entire factory. Furthermore, the control device 45 executes a picking up/dropping control operation (a taking/placing control operation) for picking up or dropping the transport subject at each of the stocking apparatuses 23, 33 in response to the transferring command.

Next, the normal process-line-to-process-line transportation, which uses the OHT 41 controlled by the control device 45, and the normal process-line-internal transportation, which uses the RGVs 42, 43 controlled by the control device 45, will be described. More specifically, there will be described the case where the semiconductor wafer, which needs to be processed at the cleaning apparatus 21 and the diffusion furnace apparatus 22c of the first process line, is transported as the transport subject.

First of all, the transport subject is transported to the stocking apparatus 23 of the first process line 20 by the OHT 41. Next, the transport subject, which is placed on the stocking apparatus 23, is picked up and transported to the stage of the cleaning apparatus 21 by the RGV 42. Thereafter, the transport subject, which is placed on the stage of the cleaning apparatus 21 after the completion of the process in the cleaning apparatus 21, is picked up and transported to the stage of the diffusion furnace apparatus 22c by the RGV 42. Thereafter, the transport subject, which is placed on the stage of the diffusion furnace apparatus 22c after the completion of the process in the diffusion furnace apparatus 22c, is picked up and transported to the stocking apparatus 23 by the RGV 42. Thereafter, the transport subject, which is placed on the stocking apparatus 23 after the completion of the processes in the first process line 20, is picked up and transported to the next process line through the process-line-to-process-line transportation by the OHT 41.

Next, there will be described a case where all of the diffusion furnace apparatuses 22a-22h of the first process line 20 are stopped (i.e., are not operated, or are not operable) due to, for example, a maintenance operation, so that a diffusion furnace apparatus 32c of the second process line 30, which is equivalent to the diffusion furnace apparatus 22c of the first process line 20, i.e., which has a function that is comparative to that of the diffusion furnace apparatus 22c of the first process line 20, is used in place of the diffusion furnace apparatus 22c.

In this case, the RGV 42 picks up the transport subject, which is placed on the stage of the cleaning apparatus 21 after the completion of the process in the cleaning apparatus 21, and the RGV 42, which holds the cleaned transport subject, travels to the relay stocking apparatus 44. At this time, the rotatable device 52a of the RGV 42 is rotated by 180 degrees from the rotational reference position while holding the transport subject with the clamper device 52c. In this way, the transport subject can be placed on the relay stocking apparatus 44 that is located on the opposite side of the rails 42a, which are opposite from the stages of the manufacturing apparatuses (the cleaning apparatus 21 and the diffusion furnace apparatuses 22a-22h) of the first process line 20 in the direction perpendicular to the longitudinal direction of the rails 42a. Thereafter, the transport subject, which is clamped by the clamper device 52c, is moved to the location above the receiving surface 44a of the table 44t by extending the extendable and retractable device 52b, and the transport subject is placed on the receiving surface 44a of the table 44t through the releasing operation of the clamper device 52c for releasing the clamped transport subject. Then, the receiving surface 44a of the table 44t is rotated by 180 degrees (see FIG. 3) in response to a command outputted from the RGV 42.

The reason why the receiving surface 44a of the table 44t is rotated is as follows. That is, as discussed above, the rails 42a of the first process line 20 and the rails 43a of the second process line 30 are opposed to each other. Therefore, the receiving surface 44a of the table 44t is rotated in order to deal with the case where the orientation (i.e., the rotational position) of the transport subject on the stage is specified for the stage of each manufacturing apparatus.

After the 180 degree rotation of the receiving surface 44a of the table 44t, on which the transport subject is placed, the RGV 43 travels to the relay stocking apparatus 44 in a state where the rotatable device 52a of the RGV 43 is rotated by 180 degrees from its rotational reference position. Then, the clamper device 52c of the RGV 43 clamps the transport subject, which is located on the receiving surface 44a of the table 44t. Then, the extendable and retractable device 52b of the RGV 43 is returned to the transporting position in the state where the transport subject is clamped by the clamper device 52c. Thereafter, the rotatable device 52a of the RGV 43 is rotated to the rotational reference position. Next, the RGV 43 travels to the stage of the diffusion furnace apparatus 32c and places the transport subject on the stage of the diffusion furnace apparatus 32c. Thereafter, the transport subject, which is placed on the stage of the diffusion furnace apparatus 32c after the completion of the process in the diffusion furnace apparatus 32c, is picked up and transported to the stocking apparatus 33 by the RGV 43. Thereafter, the transport subject, which is placed on the stocking apparatus 33 after the completion of the processes in the second process line 30, is picked up and transported to the next process line through the process-line-to-process-line transportation by the OHT 41.

As discussed above, in the transport system 40 of the present embodiment, the relay stocking apparatus 44 is placed at the corresponding location, at which the transport subject can be picked up and dropped by both of the RGV 42 and the RGV 43.

In this way, for example, in the case where the transport subject, which is processed by the previous manufacturing apparatus (the cleaning apparatus 21 in the above example) of the first process line 20, is transported to the subsequent manufacturing apparatus (the diffusion furnace apparatus 32c in the above example) of the second process line 30, the RGV 42, which has picked up the transport subject at the previous manufacturing apparatus, transports the transport subject to the relay stocking apparatus 44. Then, the transport subject, which has been placed on the relay stocking apparatus 44 by the RGV 42, is picked up by the RGV 43 and is transported to the subsequent manufacturing apparatus. As discussed above, the transport subject can be transported from the previous manufacturing apparatus of the one process line to the subsequent manufacturing apparatus of the next process line through use of the combination of the process-line-internal transportations using the RGV 42, 43 without using the OHT 41 provided for the process-line-to-process-line transportation. Therefore, even in the case where the transport subject is transported between the manufacturing apparatuses of the different process lines, it is possible to limit an increase in the transportation time, which is required for the process-line-to-process-line transportation.

Particularly, even when the relay stocking apparatus 44 is placed between the transport path of the RGV 42 and the transport path of the RGV 43, the receiving surface 44a of the table 44t, which receives the transport subject, is configured to be rotatable for at least 180 degrees in the plane of the receiving surface 44a. Therefore, even in the case where the orientation (i.e., the rotational position) of the transport subject is specified for the stage of each manufacturing apparatus, the receiving surface 44a of the table 44t can be rotated to place the transport subject to the specified orientation. Therefore, each of the RGVs 42, 43 can transport the transport subject without a need for concerning about the orientation of the transport subject.

Here, it should be noted that the relay stocking apparatus 44 may rotate the receiving surface 44a of the table 44t in response to a command outputted from the RGV 42, 43, which picks up the transport subject placed on the receiving surface 44a of the relay stocking apparatus 44. Alternatively, the relay stocking apparatus 44 may rotate the receiving surface 44a of the table 44t in response to a command outputted from the control device 45. Further alternatively, the relay stocking apparatus 44 may be constructed to sense the presence of the transport subject on the receiving surface 44a with, for example, a sensor. In such a case, the relay stocking apparatus 44 may rotate the receiving surface 44a of the table 44t in response to a sensed result of the sensor.

Furthermore, in a case where all of the manufacturing apparatuses of the first process line 20 and the second process line 30 do not require the placement of the transport subject at the corresponding specified orientation (i.e., the corresponding specified rotational position), the rotatable function of the relay stocking apparatus 44 may be eliminated.

Figure 5:
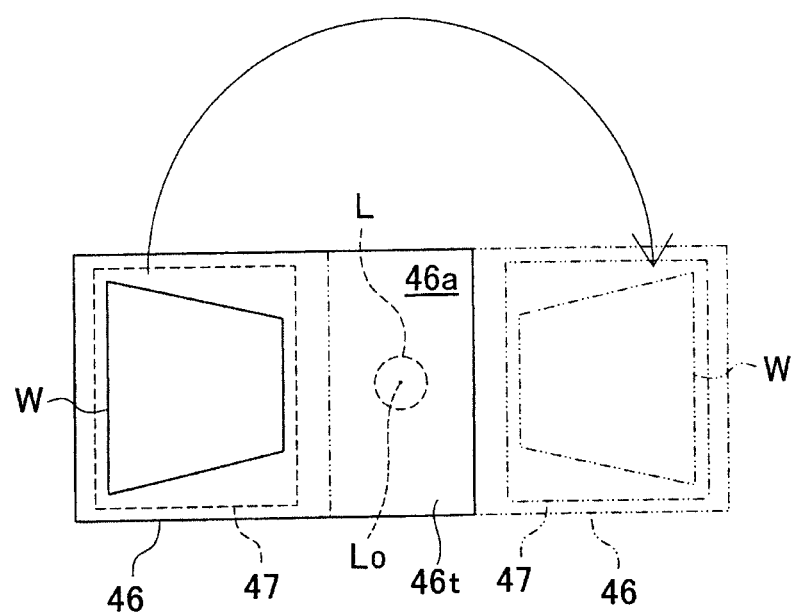
FIG. 5 is a schematic diagram showing a modification of the relay stocking apparatus of the embodiment.

FIG. 5 is a schematic diagram showing a modification of the relay stocking apparatus of the above embodiment.

In place of the relay stocking apparatus 44, it is possible to use a relay stocking apparatus that has a receiving surface, which has a receiving portion for supporting the transport subject and has the rotational center Lo that is displaced from the center of the receiving surface along the plane of the receiving surface.

Specifically, the relay stocking apparatus 46 shown in FIG. 5 may be used. In the relay stocking apparatus 46, the receiving surface 46a of the rotatable table 46t has the receiving portion (or simply referred to as a portion) 47 that supports the transport subject thereon. The receiving portion 47 is displaced from the rotational center Lo of the rotatable shaft L on the front side. Thus, the transport subject, which is placed on the receiving portion 47, is entirely displaced from the rotational center Lo of the rotatable shaft L.

Therefore, as is obvious through comparison between FIG. 3 and FIG. 5, the position of the transport subject W after the rotation of the receiving surface 46a by 180 degrees in FIG. 5 is further displaced from the position of the transport subject W after the rotation of the receiving surface 44a by 180 degrees in FIG. 3. Thereby, even in the case where the relay stocking apparatus 46 cannot be placed closer to the RGV 42, 43, the receiving portion 47 can be placed closer to the RGV 42, 43.

Alternatively, in place of the relay stocking apparatus 44, it is possible to use a relay stocking apparatus having a receiving surface of a table, which includes a receiving portion (similar to the receiving portion 47 of FIG. 5) that is displaced from the rotational center Lo of the rotatable shaft L on the rear side (instead of the front side of FIG. 5). In this way, the moving distance of the transport subject in the front-to-rear direction is reduced. Thereby, even in the case where it is difficult to displace the rails 42a away from the rails 43a, the above-described relay stocking apparatus can be used.

The present disclosure is not limited to the above embodiment and modifications thereof. That is, the above embodiment and modifications may be implemented as follows.

(1) The present disclosure is not limited to the transport system of the manufacturing facility, which manufactures the semiconductor devices. That is, the present disclosure may be applied to any other appropriate transport system that performs the process-line-to-process-line transportation and the process-line-internal transportation in any other suitable manufacturing facility (such as a manufacturing facility of a liquid crystal display (LCD) or the like). In such a case, in the process-line-to-process-line transportation, a corresponding transport subject (e.g., the LCD or the like) is transported between each corresponding two of process lines, each of which includes a plurality of manufacturing apparatuses. Furthermore, in the process-line-internal transportation, the corresponding transport subject is transported within the process line.

(2) The present disclosure is not limited to the transport system of the manufacturing facility, in which the corresponding manufacturing apparatuses are arranged one after another in one direction in the corresponding transport path in each corresponding process line. For example, the present disclosure may be equally applied to a transport system of a manufacturing facility, in which manufacturing apparatuses are arranged one after another along corresponding curved rails of the RGV 42, 43. Furthermore, the present disclosure may be applied to a transport system of a manufacturing facility, in which manufacturing apparatuses are arranged three dimensionally such that one of the manufacturing apparatuses is placed above another one of the manufacturing apparatuses.

(3) The transport vehicles of the process-line-internal transportation are not limited to the RGVs 42, 43. For example, each of the transport vehicles of the process-line-internal transportation may be an automated guided vehicle (AGV).

(4) In the RGVs 42, 43, the rotatable device 52a may be eliminated if the extendable and retractable device 52b can be extended or retracted to place the clamper device 52c to the receiving surface 44a of the table 44t of the relay stocking apparatus 44 without using the rotatable device 52a.

(5) The process-line-to-process-line transport apparatus (or the process-line-to-process-line transporting means) is not limited to the OHT 41. For example, the process-line-to-process-line transport apparatus (or the process-line-to-process-line transporting means) may be an overhead shuttle (OHS), which travels a space at the ceiling level.

(6) The transport subject W is not limited to the semiconductor wafer. That is, the transport subject W may be an object (an article), which needs another processing on it or an inspection on it. For example, the transport subject W may be a cassette (a semiconductor wafer cassette), such as a standard of mechanical interface (SMIF) or a front opening unified pod (FOUP), which receives the multiple (e.g. twenty five) semiconductor wafers and implements a localized clean environment.

Additional advantages and modifications will readily occur to those skilled in the art. The present disclosure in its broader terms is therefore not limited to the specific details, representative apparatus, and illustrative examples shown and described.

What is claimed is:
1. A transport system comprising:
  a process-line-to-process-line transport apparatus that transports a transport subject between corresponding two of a plurality of process lines, which includes a first process line and a second process line, each of the plurality of process lines includes a plurality of manufacturing apparatuses;

a first transport vehicle that transports the transport subject between a first stocking apparatus and one of the plurality of manufacturing apparatuses of the first process line and between each corresponding two of the plurality of manufacturing apparatuses of the first process line, the first stocking apparatus receives the transport subject from the process-line-to-process-line transport apparatus when the transport subject is transported by the process-line-to-process-line transport apparatus to the first process line;

a second transport vehicle that transports the transport subject between a second stocking apparatus and one of the plurality of manufacturing apparatuses of the second process line and between each corresponding two of the plurality of manufacturing apparatuses of the second process line, the second stocking apparatus receives the transport subject from the process-line-to-process-line transport apparatus when the transport subject is transported by the process-line-to-process-line transport apparatus to the second process line; and a relay stocking apparatus that receives the transport subject from one of the first transport vehicle and the second transport vehicle and passes the received transport subject to the other one of the first transport vehicle and the second transport vehicle, the relay stocking apparatus is placed between a transport path of the first transport vehicle and a transport path of the second transport vehicle;

a receiving surface of the relay stocking apparatus receives thereon the transport subject when the transport subject is supplied from the one of the first transport vehicle and the second transport vehicle to the relay stocking apparatus; and the relay stocking apparatus rotates a plane of the receiving surface with the transport subject thereon about a single rotational axis with respect to the receiving surface, the single rotational axis intersects the receiving surface, the receiving surface rotates about the rotational axis for at least 180 degrees.

2. The transport system according to claim 1, a portion of the receiving surface of the relay stocking apparatus supports the transport subject when the receiving surface receives the transport subject; and the portion of the receiving surface is displaced from a rotational center of the receiving surface in the plane of the receiving surface.

3. The transport system according to claim 1, a corresponding one of the plurality of manufacturing apparatuses of the first process line performs a process that is the same as a process performed by a corresponding one of the plurality of manufacturing apparatuses of the second process line; and the relay stocking apparatus receives the transport subject from the one of the first transport vehicle and the second transport vehicle and passes the received transport subject to the other one of the first transport vehicle and the second transport vehicle at a time of processing the transport subject by the corresponding one of the plurality of manufacturing apparatuses in one of the first process line and the second process line, to which the other one of the first transport vehicle and the second transport vehicle is provided, in a state where the corresponding one of the plurality of manufacturing apparatuses in the other one of the first process line and the second process line, to which the one of the first transport vehicle and the second transport vehicle is provided, is not available to process the transport subject after processing of the transport subject by another one of the plurality of manufacturing apparatuses in the other one of the first process line and the second process line.

4. The transport system according to claim 1, a portion of the receiving surface of the relay stocking apparatus that receives and supports the transport subject is centered about a rotational center of the receiving surface in the plane of the receiving surface.

5. The transport system according to claim 1, the receiving surface of the relay stocking apparatus is configured to:

receive the transport subject from the one of the first transport vehicle and the second transport vehicle, rotate the receiving surface with the transport subject at least 180 degrees in the plane of the receiving surface, and provide the transport subject which is rotated to the other one of the first transport vehicle and the second transport vehicle.

6. The transport system according to claim 5, the relay stocking apparatus includes a sensor, and the relay stocking apparatus rotates the receiving surface in response to the sensor sensing a presence of the transport subject on the receiving surface.

7. The transport system according to claim 5, further comprising a control device configured to control the first and second transport vehicles, and to output a command to control the receiving surface of the relay stocking apparatus so as to coordinate orientation of the transport subject, the relay stocking apparatus rotates the receiving surface in response to the command outputted from the control device.

8. A transport system that transports a transport subject between at least a first process line and a second process line, each of which include a plurality of manufacturing apparatuses, the transport system comprising:

a process-line-to-process-line transport apparatus;

a first transport vehicle;

a second transport vehicle; and a relay stocking apparatus, the first transport vehicle transports, along a first transport path, the transport subject between a first stocking apparatus associated with the first process line and one of the plurality of manufacturing apparatuses of the first process line and between each corresponding two of the plurality of manufacturing apparatuses of the first process line, the second transport vehicle transports, along a second transport path, the transport subject between a second stocking apparatus associated with the second process line and one of the plurality of manufacturing apparatuses of the second process line and between each corresponding two of the plurality of manufacturing apparatuses of the second process line, the process-line-to-process-line transport apparatus is disposed to transport the transport subject between at least the first process line and the second process line;

the relay stocking apparatus is disposed between the first transport path of the first transport vehicle and the second transport path of the second transport vehicle; the relay stocking apparatus includes a receiving surface, the receiving surface is adapted to receive the transport subject thereon, the relay stocking apparatus rotates a plane of the receiving surface with the transport subject thereon about a single rotational axis with respect to the receiving surface, the single rotational axis intersects the receiving surface, the receiving surface rotates about the rotational axis for at least 180 degrees;
(i) the process-line-to-process-line transport apparatus transports the transport subject to the first process line via the first stocking apparatus associated with the first process line;
(ii) the process-line-to-process-line transport apparatus transports the transport subject to the second process line via the second stocking apparatus associated with the second process line; and
(iii) the relay stocking apparatus (a) receives, on the receiving surface, the transport subject from one of the first transport vehicle and the second transport vehicle, and rotates, in the plane of the receiving surface, the receiving surface with the transport subject; and (b) passes the received transport subject which is rotated, from the receiving surface, to the other one of the first transport vehicle and the second transport vehicle, so as to transport the transport subject between the first process line and the second process line via the first transport vehicle, the second transport vehicle, and the relay stocking apparatus.

9. The transport system of claim 8,
the relay stocking apparatus receives the transport subject directly from the one of the first transport vehicle and the second transport vehicle, and
the relay stocking apparatus passes the received transport subject directly to the other one of the first transport vehicle and the second transport vehicle.

10. The transport system according to claim 8,
a portion of the receiving surface of the relay stocking apparatus supports the transport subject when the receiving surface receives the transport subject; and
the portion of the receiving surface is displaced from a rotational center of the receiving surface in the plane of the receiving surface.

11. The transport system according to claim 8,
a corresponding one of the plurality of manufacturing apparatuses of the first process line performs a process that is the same as a process performed by a corresponding one of the plurality of manufacturing apparatuses of the second process line; and
the relay stocking apparatus receives the transport subject from the one of the first transport vehicle and the second transport vehicle and passes the received transport subject to the other one of the first transport vehicle and the second transport vehicle at a time of processing the transport subject by the corresponding one of the plurality of manufacturing apparatuses in one of the first process line and the second process line, to which the other one of the first transport vehicle and the second transport vehicle is provided, in a state where the corresponding one of the plurality of manufacturing apparatuses in the other one of the first process line and the second process line, to which the one of the first transport vehicle and the second transport vehicle is provided, is not available to process the transport subject after processing of the transport subject by another one of the plurality of manufacturing apparatuses in the other one of the first process line and the second process line .

12. The transport system according to claim 8,
a portion of the receiving surface of the relay stocking apparatus that receives and supports the transport subject is centered about a rotational center of the receiving surface in the plane of the receiving surface.

13. The transport system according to claim 8,
the receiving surface of the relay stocking apparatus is configured to:
receive the transport subject from the one of the first transport vehicle and the second transport vehicle,
rotate the receiving surface with the transport subject at least 180 degrees in the plane of the receiving surface, and
provide the transport subject which is rotated to the other one of the first transport vehicle and the second transport vehicle.

14. The transport system according to claim 13,
the relay stocking apparatus includes a sensor, and
the relay stocking apparatus rotates the receiving surface in response to the sensor sensing a presence of the transport subject on the receiving surface.

15. The transport system according to claim 13, further comprising
a control device configured to control the first and second transport vehicles, and to output a command to control the receiving surface of the relay stocking apparatus so as to coordinate orientation of the transport subject,
the relay stocking apparatus rotates the receiving surface in response to the command outputted from the control device.

* * * * *